United States Patent
Seki et al.

(10) Patent No.: US 8,338,833 B2
(45) Date of Patent: Dec. 25, 2012

(54) METHOD OF PRODUCING SILICON CARBIDE SEMICONDUCTOR SUBSTRATE, SILICON CARBIDE SEMICONDUCTOR SUBSTRATE OBTAINED THEREBY AND SILICON CARBIDE SEMICONDUCTOR USING THE SAME

(75) Inventors: Akinori Seki, Shizuoka-ken (JP); Yukari Tani, Nagoya (JP); Noriyoshi Shibata, Nagoya (JP)

(73) Assignees: Toyota Jidosha Kabushiki Kaisha, Toyota-shi, Aichi-ken (JP); Japan Fine Ceramics Center, Nagoya (JP)

( * ) Notice: Subject to any disclaimer, the term of this patent is extended or adjusted under 35 U.S.C. 154(b) by 120 days.

(21) Appl. No.: 11/580,978

(22) Filed: Oct. 16, 2006

(65) Prior Publication Data
US 2007/0032053 A1   Feb. 8, 2007

(30) Foreign Application Priority Data
Apr. 1, 2004   (JP) .................. 2004-108746

(51) Int. Cl.
*H01L 31/0312* (2006.01)
(52) U.S. Cl. ............ 257/77; 257/E31.023; 438/767
(58) Field of Classification Search ........... 438/767; 257/77, 190, E31.023
See application file for complete search history.

(56) References Cited

U.S. PATENT DOCUMENTS

| | | | | |
|---|---|---|---|---|
| 4,900,691 A | * | 2/1990 | Jun | 438/96 |
| 6,667,489 B2 | * | 12/2003 | Suzumura et al. | 257/12 |
| 6,734,461 B1 | * | 5/2004 | Shiomi et al. | 257/77 |
| 7,067,856 B2 | * | 6/2006 | Ramdani et al. | 257/190 |
| 7,391,058 B2 | * | 6/2008 | Rowland et al. | 257/77 |
| 2002/0149021 A1 | * | 10/2002 | Casady et al. | 257/77 |
| 2002/0168868 A1 | * | 11/2002 | Todd | 438/767 |
| 2005/0079692 A1 | * | 4/2005 | Samoilov et al. | 438/481 |
| 2006/0289873 A1 | * | 12/2006 | Rowland et al. | 257/77 |

FOREIGN PATENT DOCUMENTS

| | | | |
|---|---|---|---|
| JP | 4-137771 A | | 5/1992 |
| JP | 6-53609 A | | 2/1994 |
| JP | 406-310440 A | * | 11/1994 |
| JP | 06310440 | * | 11/1994 |
| JP | A-06-310440 | | 11/1994 |
| JP | 9-301799 A | | 11/1997 |
| JP | 11-312686 | | 11/1999 |
| JP | 2000-53498 | | 2/2000 |
| JP | 2002-179498 | | 6/2002 |
| JP | 2002-261275 | | 9/2002 |
| JP | 2002-261295 | | 9/2002 |

(Continued)

OTHER PUBLICATIONS

Kamata, et al., "Influence of 4H-SiC Growth Conditions on Micropipe Dissociation," *Jpn. J. Appl. Phys.*, vol. 41 (2002) pp. L1137-L1139.

(Continued)

*Primary Examiner* — Steven J Fulk
(74) *Attorney, Agent, or Firm* — Finnegan, Henderson, Farabow, Garrett & Dunner, LLP (57) ABSTRACT

The present invention provides a method of producing a silicon carbide semiconductor substrate in which a silicon carbide buffer layer doped with germanium and a semiconductor device layer are sequentially laminated on the buffer layer, a silicon carbide semiconductor substrate obtained by the method and a silicon carbide semiconductor in which electrodes are disposed on the silicon carbide semiconductor substrate.

14 Claims, 6 Drawing Sheets

FOREIGN PATENT DOCUMENTS

| | | |
|---|---|---|
| JP | 2002-280394 | 9/2002 |
| JP | 2003-26500 | 1/2003 |

OTHER PUBLICATIONS

Tsuchida et al., "Epitaxial Growth of a Low-Doped 4H-SiC Layer on a Micropipe Stop Layer," *Jpn. J. Appl. Phys.*, vol. 41 (2002) pp. L1300-L1302.

Roe et al., "Silicon carbide and silicon carbide: germanium heterostructure bipolar transistors," *Appl. Phys. Ltrs.*, vol. 78, No. 14 (Apr. 2, 2001) pp. 2073-2075.

Notice of Reasons for Rejection dated Jun. 21, 2011, in corresponding Japanese Application No. 2004-108746, with translation, 5 pages.

\* cited by examiner

METHOD OF PRODUCING SILICON CARBIDE SEMICONDUCTOR SUBSTRATE, SILICON CARBIDE SEMICONDUCTOR SUBSTRATE OBTAINED THEREBY AND SILICON CARBIDE SEMICONDUCTOR USING THE SAME

BACKGROUND OF THE INVENTION

1. Field of the Invention

The present invention relates to a method of producing a silicon carbide (SiC) semiconductor substrate and a semiconductor substrate obtained by the method, particularly, a method of producing a semiconductor substrate provided with a semiconductor device layer (epitaxial layer) with reduced number of defects, a silicon carbide semiconductor substrate obtained by this method and to a silicon carbide semiconductor using the silicon carbide semiconductor substrate.

2. Description of the Related Art

SiC single crystals are generally produced by a sublimation method. SiC single crystals produced in the method include defects such as dislocations (edge dislocation and screw dislocation (including a micropipe)). Specifically, if SiC substrate is formed by deposition of sublimated SiC on the seed crystal of SiC, this growth technique generate the defects easily, because this process is nonequilibrium of thermodynamic.

In manufacturing a power device or high-frequency device, an epitaxial layer (semiconductor device layer), the region where a device is formed, is grown so as to form a structure suitable to the device. However, if defects are present in the substrate, they are inherited by the epitaxial layer grown on the substrate to form almost the same number of defects in the epitaxial layer as well. It has been reported that when a device is formed on an epitaxial layer having defects, current leakage is increased and breakdown voltage is lowered.

Thus, in manufacturing the device, it is extremely important to reduce the defect.

To decrease the number of micropipes in the epitaxial layer where the device is formed, a method is proposed in which a SiC single crystal to be a substrate is subjected to high-temperature treatment so that the sublimated SiC precipitates in micropipes to plug them (see, for example, Japanese Patent Application Laid-Open No. 2002-179498). There has also been disclosed a method in which SiC is grown by a CVD (Chemical Vapor Deposition) method, subjected to heat treatment so as to plug the end of micropipes, then the plugged surface is exposed by thermal etching to be used as a seed crystal to grow a SiC single crystal (see, for example, Japanese Patent Application Laid-Open No. 2000-53498), and a method to grow SiC by a CVD method under a controlled film formation condition to develop micropipes toward the defects such as dislocations (see, Jpn. J. Appl/Phys. Vol. 41 (2002) L1300, L1137).

Although the micropipes are partly plugged by such methods they are converted into numerous dislocations, and therefore the above-mentioned problems are left unsolved.

That is, because the micropipe has a Burger's vector ("b"=|nc|; n represents an integer and c represents a displacement for one atom in the direction of c axis), which remains even though the micropipe is plugged by sublimation, it is divided into smaller dislocations of the Burger's vector. Thus, there can be generated dislocations of up to n per micropipe. Having an unpaired electron, the dislocation may lower the mobility of carriers by scattering them, or lower breakdown voltage by forming a low-resistance region which becomes a current leakage path.

In view of the above-mentioned situation, the inventors of the present invention have made earnest studies and found that the defects in an epitaxial layer can be suppressed by providing a buffer layer doped with germanium on a silicon carbide single crystal substrate.

SUMMARY OF THE INVENTION

The present invention provides a silicon carbide semiconductor substrate having small number of defects in an epitaxial layer, and a defect-free semiconductor device.

A first aspect of the present invention provides a method of producing a silicon carbide semiconductor substrate in which a silicon carbide buffer layer doped with germanium is provided on a silicon carbide single crystal substrate, and further forming a semiconductor device layer on the buffer layer.

A second aspect of the present invention provides a silicon carbide semiconductor substrate obtained by the production method of the first aspect.

A third aspect of the present invention provides a silicon carbide semiconductor obtained by providing electrodes on the silicon carbide semiconductor substrate obtained by the production method of the first aspect.

DETAILED DESCRIPTION OF THE INVENTION

Embodiments of the present invention will be explained in detail referring to the figures. The embodiments are the applications of a method of producing an epitaxial layer, in which devices are formed, on the surface of a silicon carbide single crystal substrate (SiC single crystal substrate) which is formed by, for example, a sublimation method.

In the present invention, the above-mentioned silicon carbide doped with germanium indicates: a SiC having a hexagonal system which is specific to SiC, e.g. 2H, 4H, 6H, 8H, 15R, 21R and 24R, and consisting primarily of SiCGe; and a SiC having a cubic system in which Si planes and C planes are alternately laminated in the direction of <111> axis and Si and C are partly substituted with Ge, or Ge is interposed between the lattice.

(Embodiment 1)

Figure 1A:
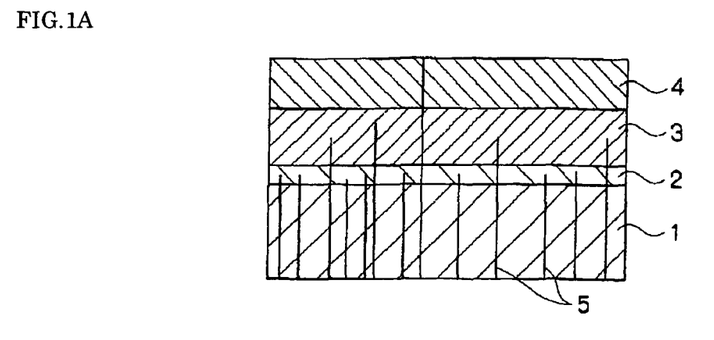
FIG. 1A to FIG. 1C are sectional views of a silicon carbide semiconductor substrate of the present invention.

FIG. 1A is an embodiment of the silicon carbide semiconductor substrate obtained by the method of the present invention. The production process is described as below:

(A) SiC Substrate 1

First, a SiC substrate 1 is obtained. As the SiC substrate 1, 4H—SiC, 3C—SiC, 6H—SiC wafers or the like may be used, and the plane direction, off-angle and the plane (Si and C) of the wafer are not particularly specified.

(B) Ge-Doped SiC Buffer Layer 3

A Ge-doped buffer layer 3 is disposed on the SiC substrate 1 by a CVD method.

Examples of the material gas used here include $SiH_2Cl_2$, $C_2H_2$, $SiH_4$, $C_3H_8$ and $Si_2H_6$.

Examples of the dopant gas include $(C_2H_5)_4Ge$, $(CH_3)_2GeH_2$, $(CH_3)_4Ge$ and $GeH_4$.

Examples of the carrier gas include $H_2$ and Ar.

Density of Ge in the above-mentioned gases is preferably 0.0001 to 2 times and particularly preferably 0.001 to 1 time that of Si, in terms of atomic supply ratio.

When a 3C—SiC is grown, temperature of the substrate is preferably 800 to 1,450° C., and particularly preferably 900 to 1,400° C. When a 4H—SiC and a 6H—SiC are grown, temperature of the substrate is preferably 1,450 to 1,770° C., and particularly preferably 1,500 to 1,650° C.

The amount of germanium in the buffer layer is preferably 10 atm % or less, particularly preferably 5 atm % or less, and still more preferably 3 atm % or less.

The film thickness of the buffer layer is preferably 1 nm to 10 μm, particularly preferably 1 nm to 1 μm, and still more preferably 1 nm to 500 nm.

The buffer layer 3 is provided to extinguish the defects from the SiC substrate 1. When the defects in the SiC single crystal substrate propagate to the buffer layer 3, the defects are terminated by the impurity Ge, thereby the propagation of the defects to the SiC epitaxial layer can be suppressed.

Since Ge-doped SiC has a larger lattice constant than SiC of the substrate, defects are formed at the interface. The defects extending from the substrate meeting with the defects formed at the interface are deflected to an in-plane direction or form loops, thereby the number of defects to propagate to the epitaxial layer can be suppressed. The interface region, where a number of defects disappear, is therefore described as a defect terminal region 2. Accordingly, the defect terminal region 2 is between the SiC substrate 1 and the Ge-doped SiC buffer layer 3.

(C) SiC Epitaxial Layer 4

The SiC epitaxial layer 4 is disposed on the buffer layer 3 by a CVD method, which can be carried out by a known process.

A silicon carbide semiconductor substrate shown in FIG. 1A is obtained in accordance with the above-mentioned processes.

(Embodiment 2)

Figure 2:
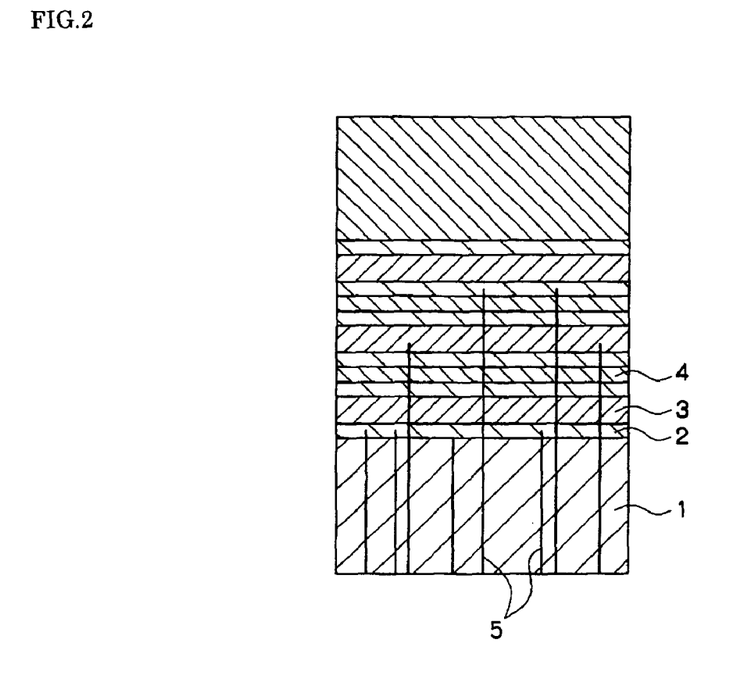
FIG. 2 is a sectional view of a silicon carbide semiconductor substrate of the present invention.

In Embodiment 2, as shown in FIG. 2, plural layers of the Ge-doped buffer layer 3 and the SiC epitaxial layer 4 of Embodiment 1 are provided. Specifically, plural Ge-doped buffer layers are disposed with the aim of further suppression of the defects.

The substrate of Embodiment 2 can be obtained by repeating the process of forming the two layers of Embodiment 1.

(Embodiment 3)

Figure 3:
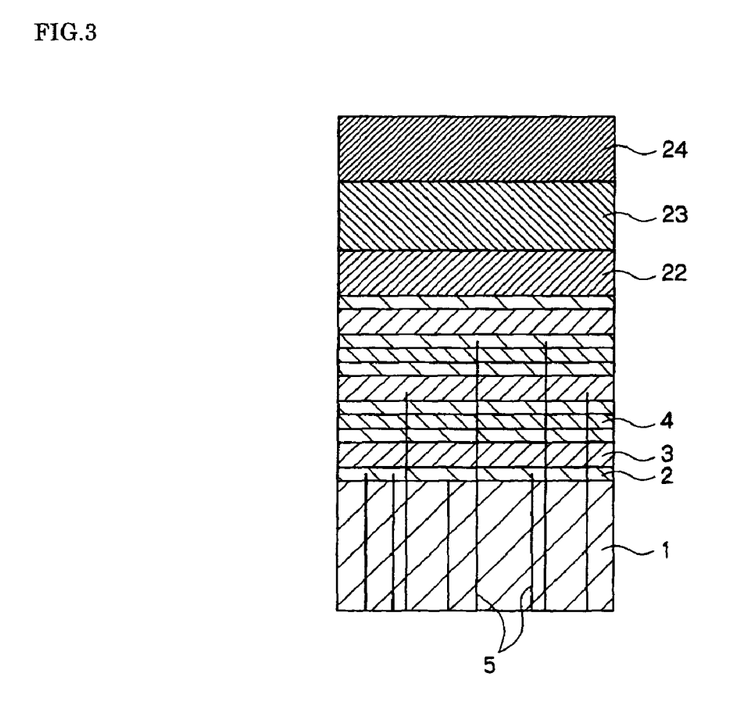
FIG. 3 is a sectional view of a silicon carbide semiconductor substrate of the present invention.

Embodiment 3, as shown in FIG. 3, is an application of Embodiment 2 in which the following layers are further provided on the substrate of Embodiment 2.

(A) SiC Epitaxial Layer 22 (Collector Layer)

The layer is p type and the dopant element is Ga, Al, B or the like.

(B) Ge-Doped SiC Epitaxial Layer 23 (Base Layer)

The layer is n type and the dopant element is N, P, As or the like.

(C) SiC Epitaxial Layer 24 on the Layer (B)

The layer is p type and the dopant element is Ga, Al, B or the like.

(Embodiment 4)

Figure 1B:
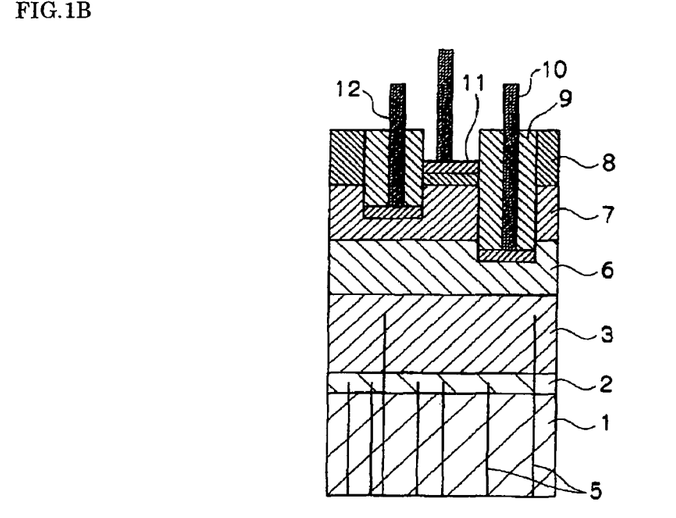

In Embodiment 4, as shown in FIG. 1B, electrodes of a base 12, an emitter 11 and a collector 10 are provided on the substrate of Embodiment 3 (the number of buffer layers is different).

(Embodiment 5)

Figure 1C:
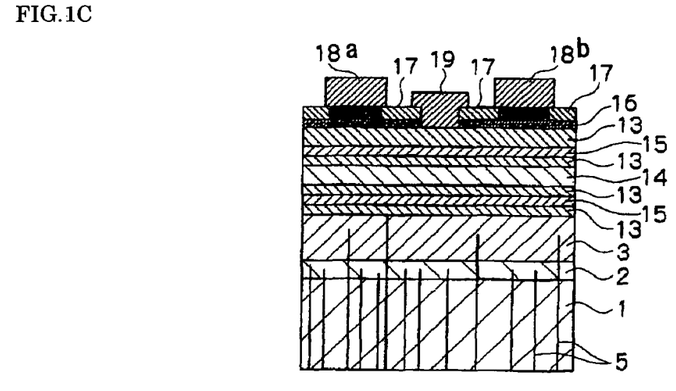

Embodiment 5 is an application of HEMT (High Electron Mobility Transistor) having the structure as shown in FIG. 1C.

In addition to the substrate of Embodiment 1, an N-doped SiC carrier supply layer 15, an undoped SiC layer 13 (spacer layer), a Ge-doped SiC channel layer 14, an undoped SiC layer 13 (spacer layer), an N-doped SiC carrier supply layer 15, an undoped SiC layer 13 (barrier layer) and an N-doped SiC contact layer 16 are sequentially disposed on the undoped SiC layer 13 by a CVD method, and further a gate electrode 19, a source electrode 18a and a drain electrode 18b are formed thereon.

The illustrative embodiments of the invention will be hereinafter explained.

1. A method of producing a silicon carbide semiconductor substrate, the method comprising:
   forming a silicon carbide buffer layer doped with germanium on a silicon carbide substrate; and
   forming a semiconductor device layer on the buffer layer.

2. The method of producing a silicon carbide semiconductor substrate of 1, wherein the amount of germanium in the buffer layer is 10 atm % or less.

3. The method of producing a silicon carbide semiconductor substrate of 1, wherein the amount of germanium in the buffer layer is 5 atm % or less.

4. The method of producing a silicon carbide semiconductor substrate of 1, wherein two or more buffer layers and two or more semiconductor device layers are formed on the silicon carbide substrate, and respective buffer layers and semiconductor layers are alternately laminated.

5. The method of producing a silicon carbide semiconductor substrate of 1, wherein the thickness of the buffer layer is 1 nm to 1 μm.

6. The method of producing a silicon carbide semiconductor substrate of 1, wherein the semiconductor device layer is produced by laminating a p-type semiconductor device layer, an n-type semiconductor device layer and a p-type semiconductor device layer in this order.

7. A silicon carbide semiconductor substrate obtained by a method of producing a silicon carbide semiconductor substrate, the method comprising:
   forming a silicon carbide buffer layer doped with germanium on a silicon carbide substrate; and
   forming a semiconductor device layer on the buffer layer.

8. The silicon carbide semiconductor substrate of 7, wherein the amount of germanium in the buffer layer is 10 atm % or less.

9. The silicon carbide semiconductor substrate of 7, wherein the amount of germanium in the buffer layer is 5 atm % or less.

10. The silicon carbide semiconductor substrate of 7, wherein two or more buffer layers and two or more semiconductor device layers are formed on the silicon carbide substrate, and respective buffer layers and semiconductor layers are alternately laminated.

11. The silicon carbide semiconductor substrate of 7, wherein the thickness of the buffer layer is 1 nm to 1 μm.

12. The silicon carbide semiconductor substrate of 7, wherein the semiconductor device layer is produced by laminating a p-type semiconductor device layer, an n-type semiconductor device layer and a p-type semiconductor device layer in this order.
13. A silicon carbide semiconductor produced by disposing electrodes on the silicon carbide semiconductor substrate obtained by a method of producing a silicon carbide semiconductor substrate, the method comprising:
forming a silicon carbide buffer layer doped with germanium on a silicon carbide substrate; and
forming a semiconductor device layer on the buffer layer.
14. The silicon carbide semiconductor of 13, wherein the amount of germanium in the buffer layer is 10 atm % or less.
15. The silicon carbide semiconductor of 13, wherein the amount of germanium in the buffer layer is 5 atm % or less.
16. The silicon carbide semiconductor of 13, wherein two or more buffer layers and two or more semiconductor device layers are formed on the silicon carbide substrate, and respective buffer layers and semiconductor layers are alternately laminated.
17. The silicon carbide semiconductor of 13, wherein the thickness of the buffer layer is 1 nm to 10 μm.
18. The silicon carbide semiconductor of 13, wherein the semiconductor device layer is produced by laminating a p-type semiconductor device layer, an n-type semiconductor device layer and a p-type semiconductor device layer in this order.

EXAMPLES

Example 1

Production of a silicon carbide semiconductor substrate (see FIG. 1A)
(1) SiC Substrate 1
  A 4H—SiC substrate: a wafer having a surface crystal face bearing of (0001) 8° off [11-20] was used as SiC substrate 1.
(2) Formation of the Buffer Layer (SiC Layer) 3 by a CVD Method
  The condition of the CVD method was as follows:
  Material gas: 13 mL/min of $SiH_2Cl_2$ and 3.3 mL/min of $C_2H_2$.
  Dopant gas: 10 mL/min of Ar carrier gas was allowed to flow in $(C_2H_5)_4Ge$ at 15° C.
  Carrier gas: 500 mL/min of $H_2$.
  Substrate temperature: 1,450 to 1,770° C. (limited to 4H—SiC).
  The thickness of the obtained layer was 10 nm and the amount of germanium in the layer was 0.6 atm %.
(3) Formation of the Semiconductor Device Layer (SiC Epitaxial Layer) 4
  The condition of the CVD method was as follows:
  Material gas: 13 mL/min of $SiH_2Cl_2$ and 3.3 mL/min of $C_2H_2$.
  Carrier gas: 500 mL/min of $H_2$.
  Substrate temperature: 1,450 to 1,770° C. (limited to 4H—SiC).
  The thickness of the obtained layer was 4 μm.
(Evaluation)
Etch Pits Counting
  Etching was carried out by dipping the sample in KOH at a temperature of 550° C. for 20 minutes.
  Etch pits counting was measured by an optical microscope (the counting magnification was adjusted so that etch pits on the order of $10^2$ can be observed in the area of 75 mm×90 mm).
  Etch pits counting of the obtained substrate was less than 5,000 $cm^{-2}$.

Comparative Example

The etch pits density of the substrate in which the semiconductor device layer (SiC epitaxial layer) of the above-described step (3) was formed directly on a commercially available substrate (4H—SiC wafer) by a CVD method was more than 50,000 $cm^{-2}$.

Example 2

Production of a silicon carbide semiconductor substrate according to Embodiment 2 (FIG. 2)
  A silicon carbide semiconductor substrate of Embodiment 2 was obtained in accordance with the same method as Example 1, except that the steps (2) and (3) were alternately repeated three times respectively. The substrate was evaluated in the same manner as Example 1. Etch pits counting of the obtained substrate was less than 1,000 $cm^{-2}$.

Example 3

Production of a silicon carbide semiconductor substrate of Embodiment 3 (FIG. 3)
(1) The outermost epitaxial SiC layer 22 of Example 2 was grown so as to be p-type by adding a trace amount of $(CH_3)_3Ga$ gas to a material gas. The growth condition, specification and the like of the outermost epitaxial SiC layer 22 were the same as the step (3) in Example 1, except that the density of Ga was $6\times10^{19}/cm^3$.
(2) A Ge-, N-doped SiC layer 23 was grown on (1) so as to be n-type by adding a trace amount of $N_2$ gas to a material gas. Other conditions were the same as the step (2) in Example 1, except that the density of N was $1\times10^{17}/cm^3$.
(3) An epitaxial SiC layer 24 was grown on the Ge-, N-doped SiC layer 23. The method was the same as that of (1), except that the density of Ga was $3\times10^{20}/cm^3$.

Example 4

Application of Embodiment 4 to a semiconductor device structure HBT (Hetero Bipolar Transistor) (FIG. 1B)
(1) A resist was formed to the substrate of Example 3 by a photolithographic process so that the region where a device was to be formed was open.
(2) Dry or wet etching was carried out until the thickness of SiC film in the region for an emitter electrode 11 was reduced to a desired film thickness.
(3) A resist was formed by a photolithographic process so that the region for a base electrode 12 and a collector electrode 10 was open.
(4) Dry or wet etching was carried out until the thickness of SiC film in the region for a base electrode 12 was reduced to a desired film thickness.
(5) A resist was formed by a photolithographic process so that the region for a collector electrode 10 was open.
(6) Dry or wet etching was carried out until the thickness of SiC film in the region for the collector electrode 10 was reduced to a desired film thickness.

(7) A resist was formed by a photolithographic process so that the region for the base electrode 12, collector electrode 10 and emitter electrode 11 was open.
(8) Ni was evaporated by a sputtering or an electron beam vapor deposition method.
(9) The evaporated Ni film other than the region for the electrodes was removed by dissolving the resist using acetone.
(10) The substrate was heated at 1,000° C. for several minutes in an Ar or $H_2$ atmosphere to get the ohmic property of the base electrode 12, emitter electrode 11 and collector electrode 10.
(11) A photoresist was formed in a pattern to cover the center part of the base electrode 12 and the collector electrode 10 (the periphery thereof was open) and the emitter electrode 11, then a $SiO_2$ film was formed by a CVD or a sputtering method, and thereafter the photoresist was removed.
(12) After a photoresist was formed in a pattern to form lead wiring, Ni was evaporated by a sputtering or an electron beam vapor deposition method.
(13) The photoresist was removed by an ashing process.

Example 5

Figure 4A:
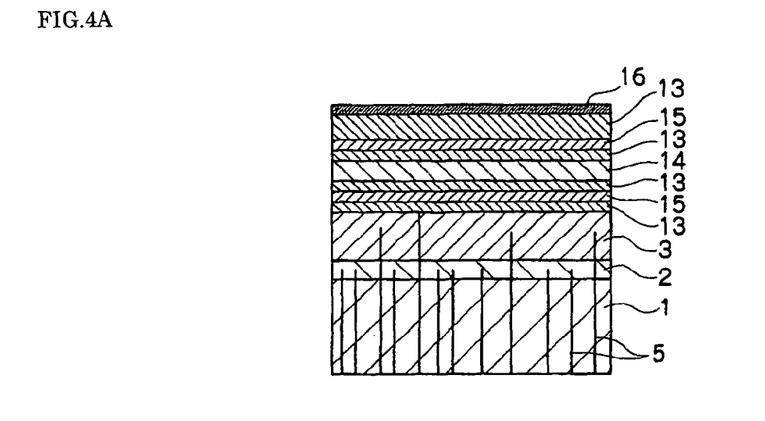
FIG. 4A to FIG. 4C are sectional views of a silicon carbide semiconductor substrate of the present invention.
Figure 4B:
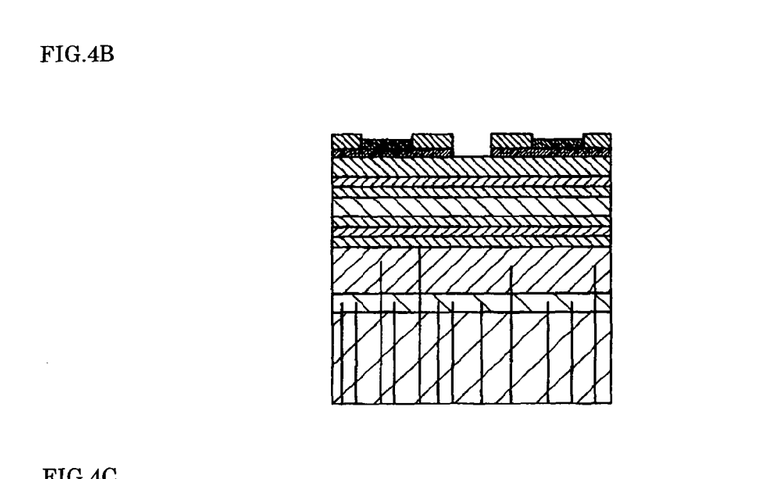
Figure 4C:
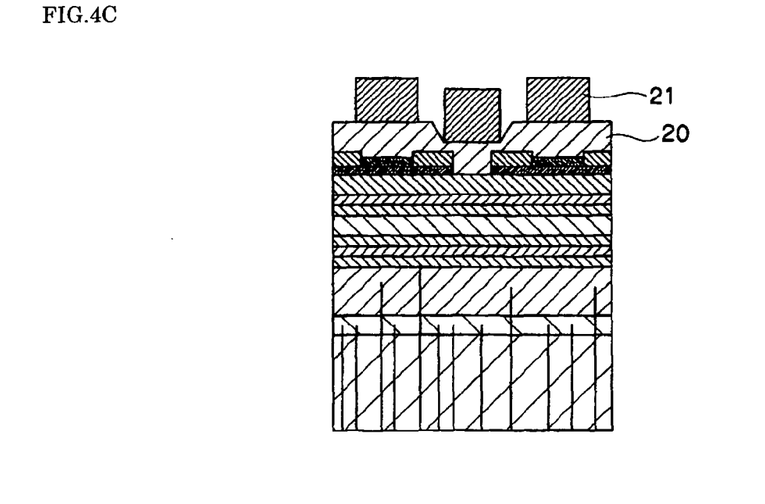

Application of Embodiment 5 to a semiconductor device structure HEMT (High Electron Mobility Transistor) (FIG. 1C and FIG. 4A to FIG. 4C)
(1) A Ge-doped SiC buffer layer 3 (for defect reduction), an undoped SiC layer 13, an N-doped SiC carrier supply layer 15, an undoped SiC layer (spacer layer) 13, a Ge-doped SiC channel layer 14, an undoped SiC layer (spacer layer) 13, an N-doped SiC carrier supply layer 15, an undoped SiC layer (barrier layer) 13 and an N-doped SiC contact layer 16 were sequentially laminated on the SiC substrate (semi-insulating) 1, in the same manner as Example 1 by a CVD method (FIG. 4A).
(2) A $SiO_2$ film was formed on the side of the surface of the epitaxial layer by a CVD or a sputtering method.
(3) A resist was formed by a photolithographic process so that the region where a source and drain electrodes were to be formed was open.
(4) The openings were formed in $SiO_2$ film by dry or wet etching.
(5) Ni (or MoSi and the like) was evaporated by a sputtering or an electron beam vapor deposition method.
(6) Patterning of the source and drain electrodes was conducted by removing the Ni film, leaving the region for the source and drain electrodes, by a lift-off process in which the resist underneath was removed together, using a solvent capable of peeling a resist such as acetone.
(7) The substrate was heated at 1,000° C. for several minutes in an Ar or $H_2$ atmosphere to get the ohmic property of the source and drain electrodes.
(8) A resist was formed by a photolithographic process so that the region for a gate electrode 19 was open.
(9) The $SiO_2$ film in the region where the gate electrode 19 was to be formed was etched by dry or wet etching.
(10) The resist was removed by ashing or using a solvent capable of peeling the resist.
(11) The N-doped SiC contact layer 16 in the region where the gate electrode 19 was to be formed was etched by dry etching.
(12) A $SiO_2$ film was formed on the side of the surface of the epitaxial layer by a CVD or a sputtering method and the like, the same process as the steps (8) to (10) was conducted so that the $SiO_2$ film in the region for source, drain and gate electrodes was open, and the resist was removed (see FIG. 4B).
(13) A Ti/TiN/Al film 20 was evaporated by a sputtering or an electron beam vapor deposition method.
(14) A resist 21 was formed leaving the source, drain and gate electrodes (FIG. 4C) by a photolithographic process.
(15) The Ti/TiN/Al film 20 was etched by dry or wet etching using the resist 21 as a mask, to form a source, drain and gate electrodes.
(16) The resist for the etching mask was removed by ashing or using a resist-peeling solution.

Example 6

Figure 5A:
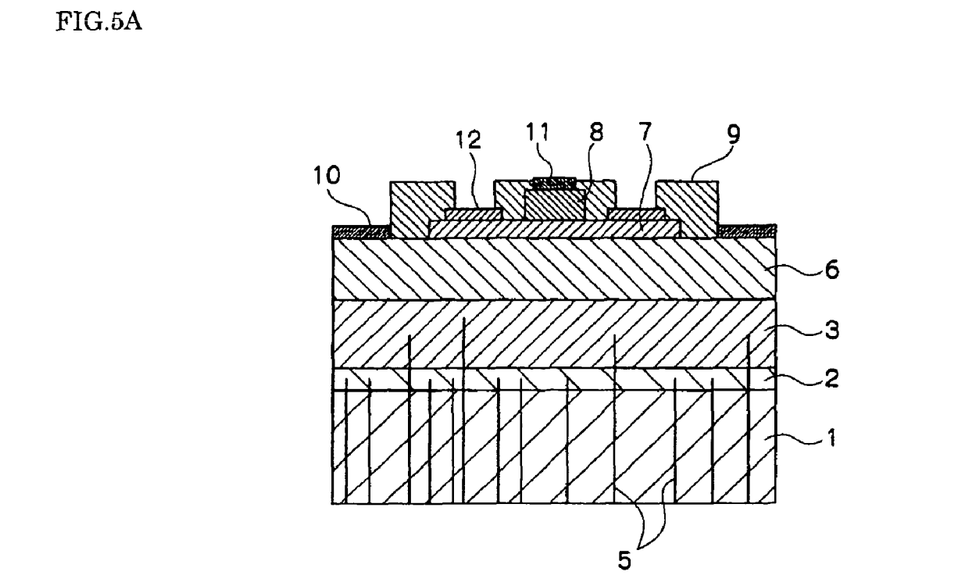
FIG. 5A and FIG. 5B are a sectional view and a plan view of a silicon carbide semiconductor substrate of the present invention.
Figure 5B:
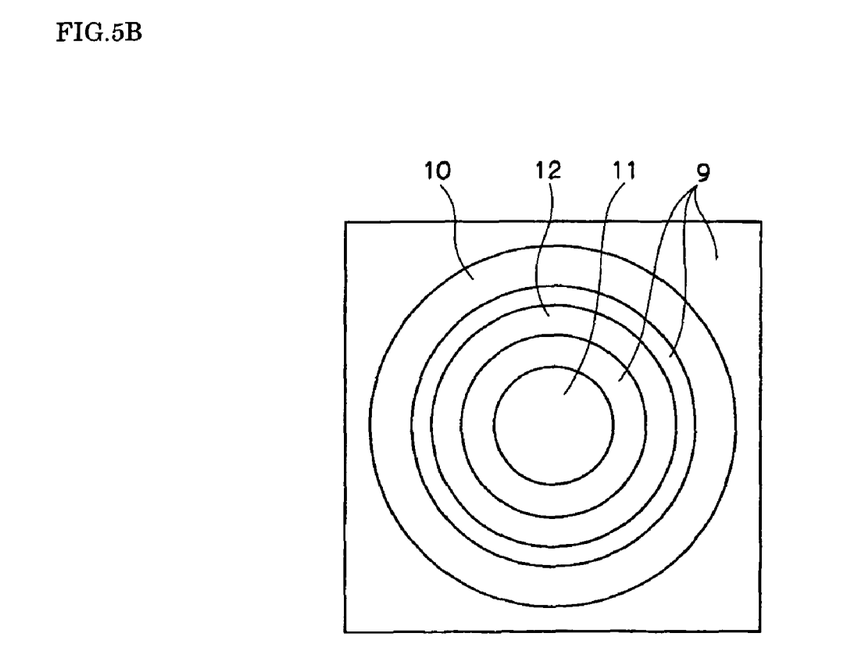

A pnp-type HBT device structure (1) (FIG. 5A and FIG. 5B)
The production process was the same as Example 4.

Example 7

Figure 6:
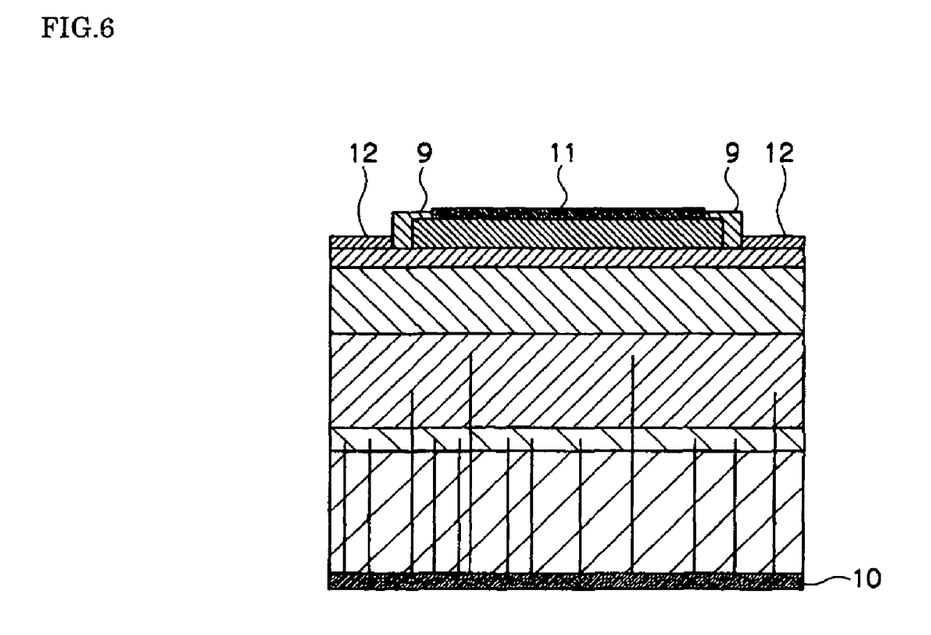
FIG. 6 is a sectional view of a silicon carbide semiconductor substrate of the present invention.

A pnp-type HBT device structure (2) (FIG. 6)
The production process was carried out in the same manner as in Example 4, except that the collector electrode 10 was formed on the backface of the device, which was effective for a device for a large-current because the amount of current per device area can be secured by a large region for a collector electrode.

Example 8

Figure 7:
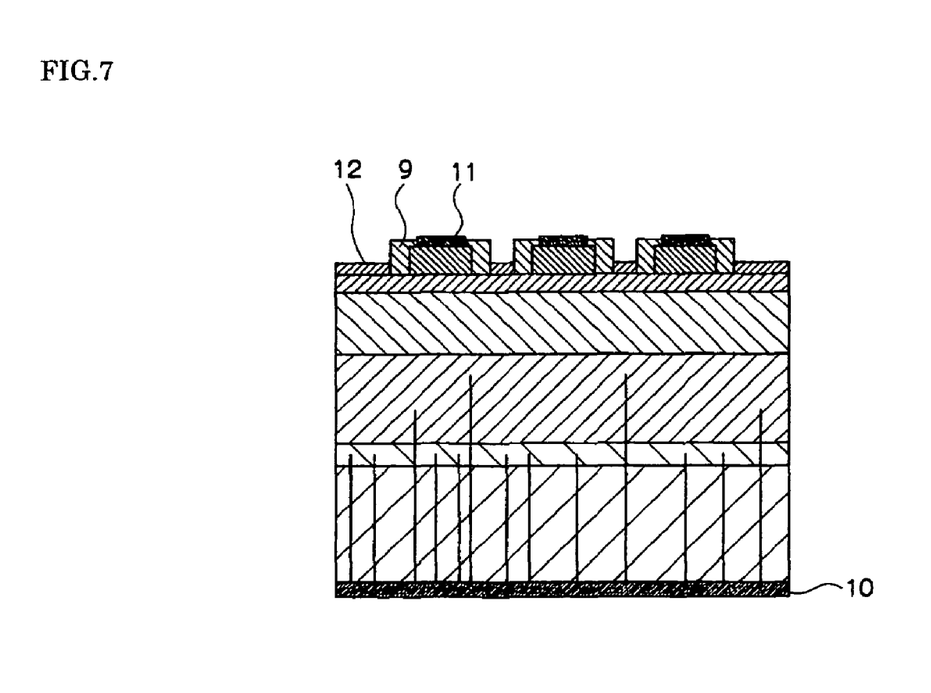
FIG. 7 is a sectional view of a silicon carbide semiconductor substrate of the present invention.

A pnp-type HBT device structure (3) (FIG. 7)
The production process was the same as in Example 4, except that the device has a multi-channel structure.

Example 9

Figure 8:
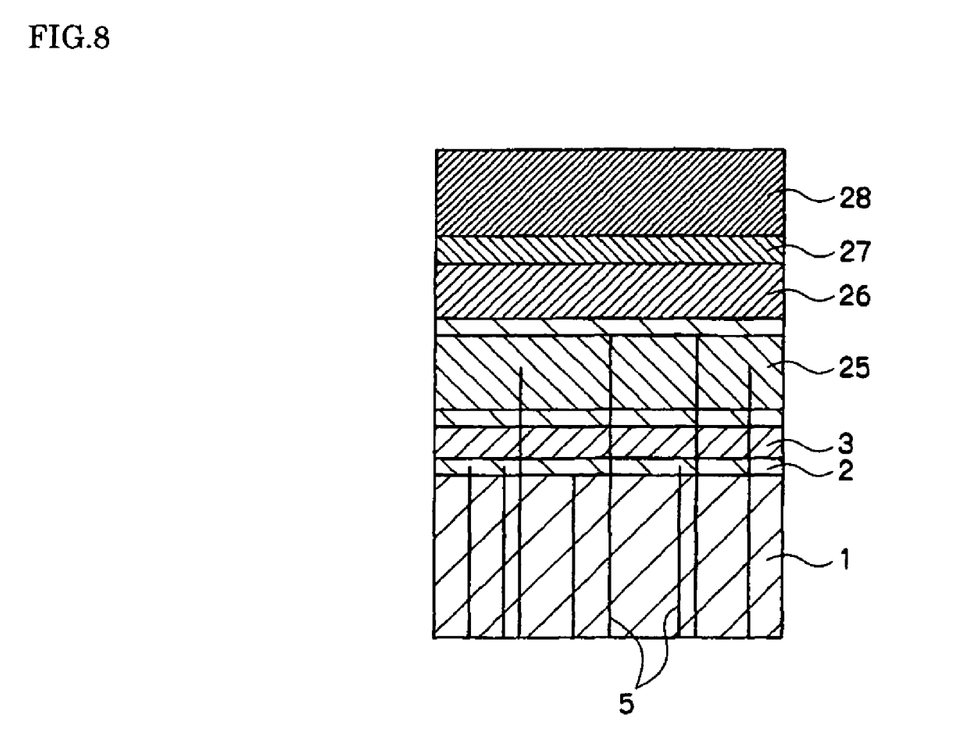
FIG. 8 is a sectional view of a silicon carbide semiconductor substrate of the present invention.

An npn-type HBT device structure (FIG. 8)
The device of this example takes an epitaxial wafer structure using a base/collector having a smaller forbidden bandwidth than that of an emitter, in which a Ge and N-doped SiC layer 26, a Ge and Al (or B)-doped SiC layer 27 and an N-doped SiC layer 28 were sequentially laminated on a SiC epitaxial buffer layer 25 (FIG. 8). The production process was carried out in the same manner as Example 4 to obtain an npn-type HBT device structure.

The semiconductor obtained by the present invention can reduce the number of defects in the semiconductor device layer, current leakage of the device and chances of dropping in reverse voltage.

Therefore, the present invention provides a silicon semiconductor substrate having small number of defects in the epitaxial layer where a device was to be formed and a defect-free semiconductor.

All publications, patent applications, and technical standards mentioned in this specification are herein incorporated by reference to the same extent as if each individual publication, patent application, or technical standard was specifically and individually indicated to be incorporated by reference.

What is claimed is:
1. A method of producing a silicon carbide semiconductor substrate, the method comprising:
  providing a silicon carbide substrate;
  forming a silicon carbide buffer layer doped with germanium directly in contact with the silicon carbide substrate;

terminating defects at an interface of the silicon carbide substrate and the silicon carbide buffer layer doped with germanium; and forming an epitaxial semiconductor device layer on the buffer layer;

wherein an amount of germanium dopant in the buffer layer is from 0.6 atm % to 10 atm %, and the thickness of the buffer layer is 1 nm to 500 nm.

2. The method of producing a silicon carbide semiconductor substrate of claim 1, wherein the amount of germanium in the buffer layer is from 0.6 atm % to 5 atm %.

3. The method of producing a silicon carbide semiconductor substrate of claim 1, wherein two or more buffer layers and two or more semiconductor device layers are formed on the silicon carbide substrate, and respective buffer layers and semiconductor layers are alternately laminated.

4. The method of producing a silicon carbide semiconductor substrate of claim 1, wherein the semiconductor device layer is produced by laminating a p-type semiconductor device layer, an n-type semiconductor device layer, and a p-type semiconductor layer in this order.

5. The method of producing a silicon carbide semiconductor substrate of claim 1, wherein the amount of germanium in the buffer layer is from 0.6 atm % to 3 atm %.

6. The method of producing a silicon carbide semiconductor substrate of claim 1, wherein the semiconductor device layer is formed directly in contact with and above the silicon carbide buffer layer.

7. A silicon carbide semiconductor substrate obtained by a method of producing a silicon carbide semiconductor substrate, the method comprising:

providing a silicon carbide substrate;

forming a silicon carbide buffer layer doped with germanium directly in contact with the silicon carbide substrate;

terminating defects at an interface of the silicon carbide substrate and the silicon carbide buffer layer doped with germanium; and forming an epitaxial semiconductor device layer on the buffer layer;

wherein an amount of germanium dopant in the buffer layer is from 0.6 atm % to 10 atm %, and the thickness of the buffer layer is 1 nm to 500 nm.

8. The silicon carbide semiconductor substrate of claim 7, wherein the amount of germanium in the buffer layer is from 0.6 atm % to 5 atm %.

9. The silicon carbide semiconductor substrate of claim 7, wherein two or more buffer layers and two or more semiconductor device layers are formed on the silicon carbide substrate, and respective buffer layers and semiconductor layers are alternately laminated.

10. The silicon carbide semiconductor substrate of claim 7, wherein the semiconductor device layer is produced by laminating a p-type semiconductor device layer, an n-type semiconductor device layer, and a p-type semiconductor layer in this order.

11. A silicon carbide semiconductor produced by disposing electrodes on the silicon carbide semiconductor substrate obtained by a method of producing a silicon carbide semiconductor substrate, the method comprising:

providing a silicon carbide substrate;

forming a silicon carbide buffer layer doped with germanium directly in contact with the silicon carbide substrate;

terminating defects at an interface of the silicon carbide substrate and the silicon carbide buffer layer doped with germanium; and forming an epitaxial semiconductor device layer on and above the buffer layer;

wherein an amount of germanium dopant in the buffer layer is from 0.6 atm % to 10 atm %, and the thickness of the buffer layer is 1 nm to 500 nm.

12. The silicon carbide semiconductor of claim 11, wherein the amount of germanium in the buffer layer is from 0.6 atm % to 5 atm %.

13. The silicon carbide semiconductor of claim 11, wherein two or more buffer layers and two or more semiconductor device layers are formed on the silicon carbide substrate, and respective buffer layers and semiconductor layers are alternately laminated.

14. The silicon carbide semiconductor of claim 11, wherein the semiconductor device layer is produced by laminating a p-type semiconductor device layer, an n-type semiconductor device layer, and a p-type semiconductor layer in this order.

* * * * *